(12) United States Patent
Bode et al.

(10) Patent No.: US 6,184,824 B1
(45) Date of Patent: Feb. 6, 2001

(54) PROCESS FOR INITIALIZING A RECEIVER FOR DETERMINING POSITION AND CORRESPONDING RECEIVER

(75) Inventors: Friedrich-Wilhelm Bode, Apelern; Volkmar Tanneberger, Hildesheim, both of (DE)

(73) Assignee: Robert Bosch GmbH, Stuttgart (DE)

( * ) Notice: Under 35 U.S.C. 154(b), the term of this patent shall be extended for 0 days.

(21) Appl. No.: 09/242,572

(22) PCT Filed: Jul. 1, 1997

(86) PCT No.: PCT/DE97/01375

§ 371 Date: Feb. 18, 1999

§ 102(e) Date: Feb. 18, 1999

(87) PCT Pub. No.: WO98/08109

PCT Pub. Date: Feb. 26, 1998

(30) Foreign Application Priority Data

Aug. 20, 1996 (DE) .............................................. 196 33 477

(51) Int. Cl.$^7$ ........................................................ G01S 5/02
(52) U.S. Cl. ............................ 342/357.15; 342/357.01; 342/357.06; 342/357.13; 701/207; 701/213
(58) Field of Search .......................... 342/357.01–357.17; 701/200, 207, 213–216

(56) References Cited

U.S. PATENT DOCUMENTS

| | | | |
|---|---|---|---|
| 5,155,491 | * | 10/1992 | Ando ................................ 342/357.15 |
| 5,364,093 | * | 11/1994 | Huston et al. ............... 342/357.03 X |
| 5,739,786 | * | 4/1998 | Greenspan et al. ................ 342/357.1 |
| 5,751,244 | * | 5/1998 | Huston et al. ................... 342/357.03 |
| 5,784,027 | * | 7/1998 | Davis ............................... 342/357.08 |

FOREIGN PATENT DOCUMENTS 0 635 728    1/1995    (EP) .

OTHER PUBLICATIONS

Cariveau, B.K. et al., "Satellite Data Management in DOD Navstar GPS Receivers," Navigation into the 21st Century, Kissemmee, Nov. 29–Dec. 2, 1988, No. 1998, Nov. 29, 1988, IEEE, pp. 134–144.

Patent Abstracts of Japan, vol. 012, No. 396 (p–774), Oct. 21, 1988.

* cited by examiner

Primary Examiner—Bernarr E. Gregory
(74) Attorney, Agent, or Firm—Kenyon & Kenyon

(57) ABSTRACT

A method for initialization of a receiver, and a receiver of position signals, are proposed, a sequence of transmitter identifiers being searched through for an active transmitter, and the sequence of transmitter identifiers comprising satellites which are positioned in orbits that are located approximately perpendicular to one another.

10 Claims, 3 Drawing Sheets

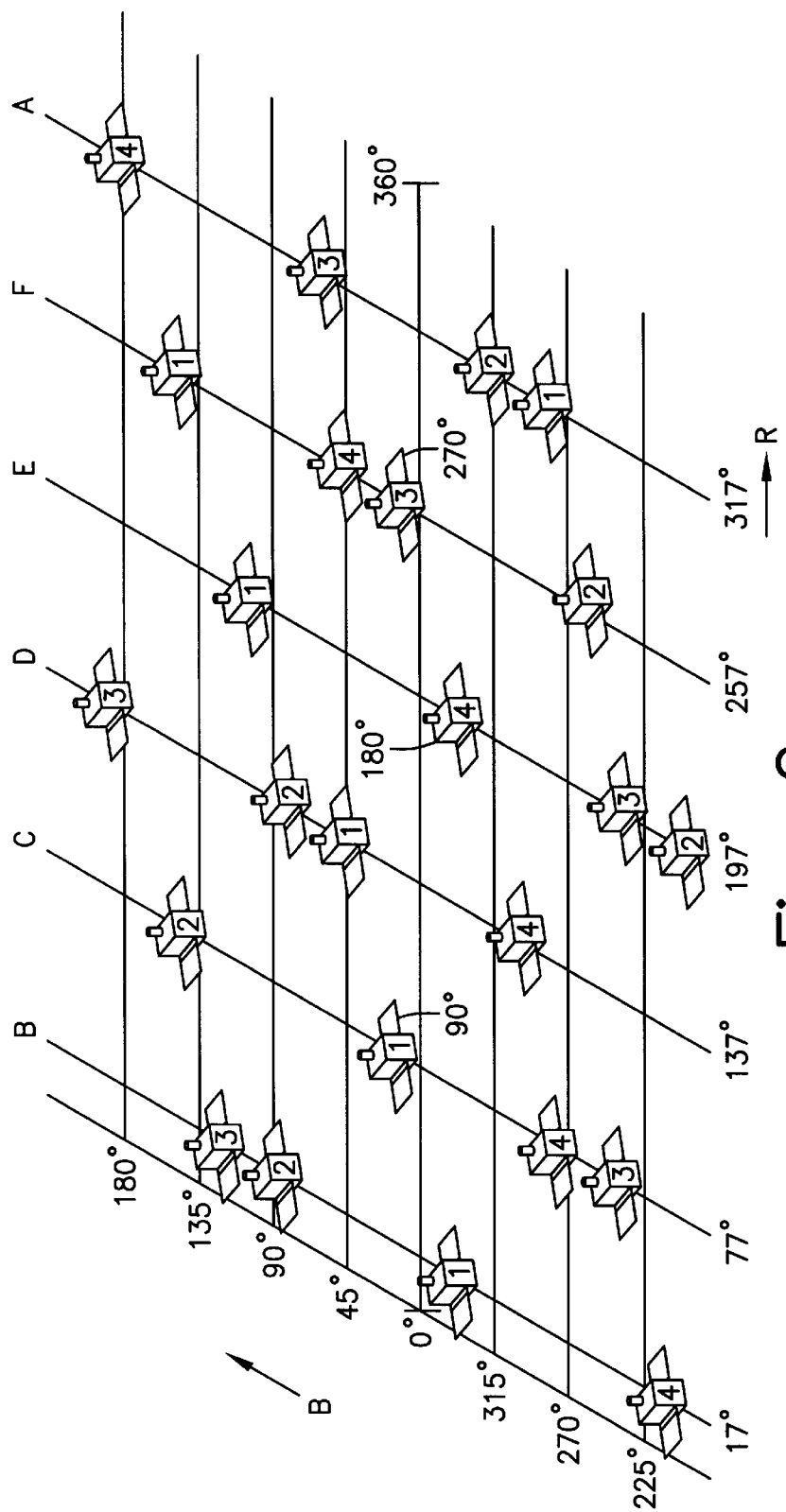

PROCESS FOR INITIALIZING A RECEIVER FOR DETERMINING POSITION AND CORRESPONDING RECEIVER

FIELD OF THE INVENTION

The present invention relates to a method for initialization of a receiver and a receiver of position signals.

BACKGROUND INFORMATION

With the increasing popularity of traffic telematics and navigation devices, for example in motor vehicles, location functionality is becoming increasingly significant. In this context, greater use is being made of positioning receivers, for example for the NAVSTAR global positioning system (GPS), which allow a three-dimensional position determination by measuring time-of-flight to multiple GPS satellites. What is demanded for the receivers is not only the greatest possible position accuracy and available, but also the shortest possible "time to first fix" (TTFF), i.e. the time elapsing between activation of the receiver and the first calculation and output of a position. TTFF for GPS receivers is usually specified for different start modes, a distinction being made between hot and cold starts. In a cold start, no current system data or operating parameters are available in the receiver, or the data are outdated and may no longer conform to the actual system data or operating parameters. Because this information is lacking, the visible or favorably receivable satellites cannot be identified in the receiver, and the receiver is therefore instructed to test individually the 32 satellites provided in the GPS system specification. In this process, the receiver is initialized with so-called search sets, corresponding to the number of parallel channels available, which allow a more or less orderly search through the satellites. In an eight-channel receiver, it is known to use eight different satellite identifiers per search set, the satellite identifiers (which are listed as PRN numbers) being searched through in sequence. It is thus possible, depending on the position of the receiver, for a long period to elapse before a satellite is found that is available for communication.

SUMMARY OF THE INVENTION

The method according to the present invention has in contrast, the advantage that a specific sequence of transmitter identifiers, i.e. a specific search set, which with high probability contains an active and receivable satellite, is selected. In this context, the satellite identifiers selected for the search runs are those whose transmitters are known to be moving along orbital paths that are almost perpendicular to one another. With this feature, successfully receivable satellites are found with high probability after only the first search set.

It is particularly advantageous that transmission of all the transmitter parameters is begun after the first active transmitter is discovered; and that after these transmitter parameters have been completely transmitted, a calculation is made of the current sequence of transmitter identifiers, i.e. the current list of search sets, that can be used at the next receiver cold start. It is in turn advantageous, when calculating the current list of search sets, that the movement planes of the transmitters lie almost at right angles to one another. This increases the statistical probability that receivable transmitters will be found as quickly as possible upon a cold start.

It is furthermore advantageous that after the discovery of first receivable satellites, and after the associated reduction in the number of available receiver channels, the search sets are also partly loaded and processed. In this case, a number of satellite identifiers corresponding to the quantity of receiver channels is loaded from the list of search sets, and allocated to the unoccupied receiver channels. Provision is to be made that all the satellite identifiers are processed in the sequence defined by the list of search sets.

In a concluding process step, the calculation of the search sequences is stored in a resident memory so that the next time the receiver is initialized, a first, updated search set can be immediately accessed. The method has the advantage that the cold start time, or "time to first fix" time, is shortened. As a result, the navigation data of the receiver are available more quickly after activation. Because the search data are updated, the receiver can be adapted quickly and easily to the actual circumstances of the transmitter. It is very easy to react to failure of a satellite transmitter or to replacement of a satellite.

It is advantageous that the data of the search set stored in the memory are updated not only after each cold start, but rather at predefined time intervals.

It is further possible to supplement the stored data with information regarding initial position and most-recently used set of transmitter identifiers. This allows even faster initialization of the receiver.

The receiver according to the present invention has the advantage that a list of search sets is stored in the receiver, such that the transmitter identifiers of the individual search sets belong to transmitters which move in orbital planes located almost perpendicular to one another.

It is advantageous that the receiver has means which serve to calculate a current list of search sets.

It is further advantageous that the current search sets can be stored in the receiver.

BRIEF DESCRIPTION OF THE DRAWINGS

FIG. 2 shows the division of the satellites among the various orbits.

FIG. 3 shows the identification of the satellites.

DETAILED DESCRIPTION

Figure 1:
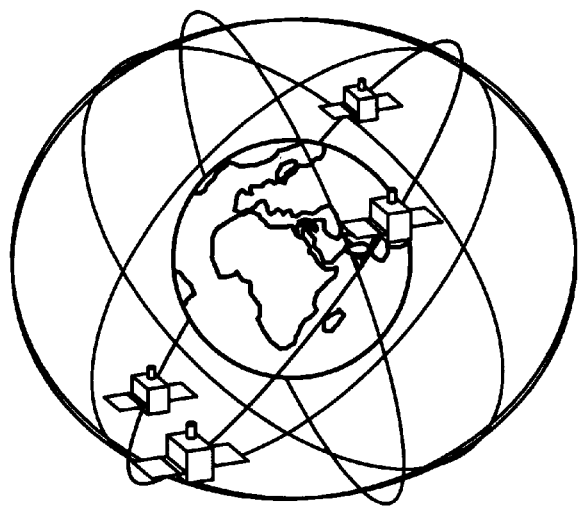
FIG. 1 shows satellite orbits.

A preferred exemplary embodiment uses the NAVSTAR GPS satellites for position determination. FIG. 1 shows the layout of the orbits, on each of which four satellites are positioned. With NAVSTAR there are thus 24 satellites currently available as transmitters. FIG. 2 shows the current distribution (in June, 1996) of the satellites on the respective satellite orbits A through F. The four satellites in each case are located on an orbital track whose plane is inclined 60 degrees with respect to the equatorial plane. The angle between the individual planes is also 60 degrees, and is plotted on the R axis. The individual satellites can be identified, as shown in FIG. 3, by their different PRN codes in the receiver. For a cold start, the method according to the present invention provides for selecting from the PRN numbers, for the search sets, planes which are as close as possible to perpendicular to one another, including all the satellites of those planes. This results, at any point on Earth and without any knowledge of the initial position, the greatest probability of receiving at least one visible satellite of that set. For an eight-channel receiver, the first set can comprise, for example, satellites of planes C and A, the second search set satellites of planes B and D, and the third search set satellites of planes E and F.

Figure 4:
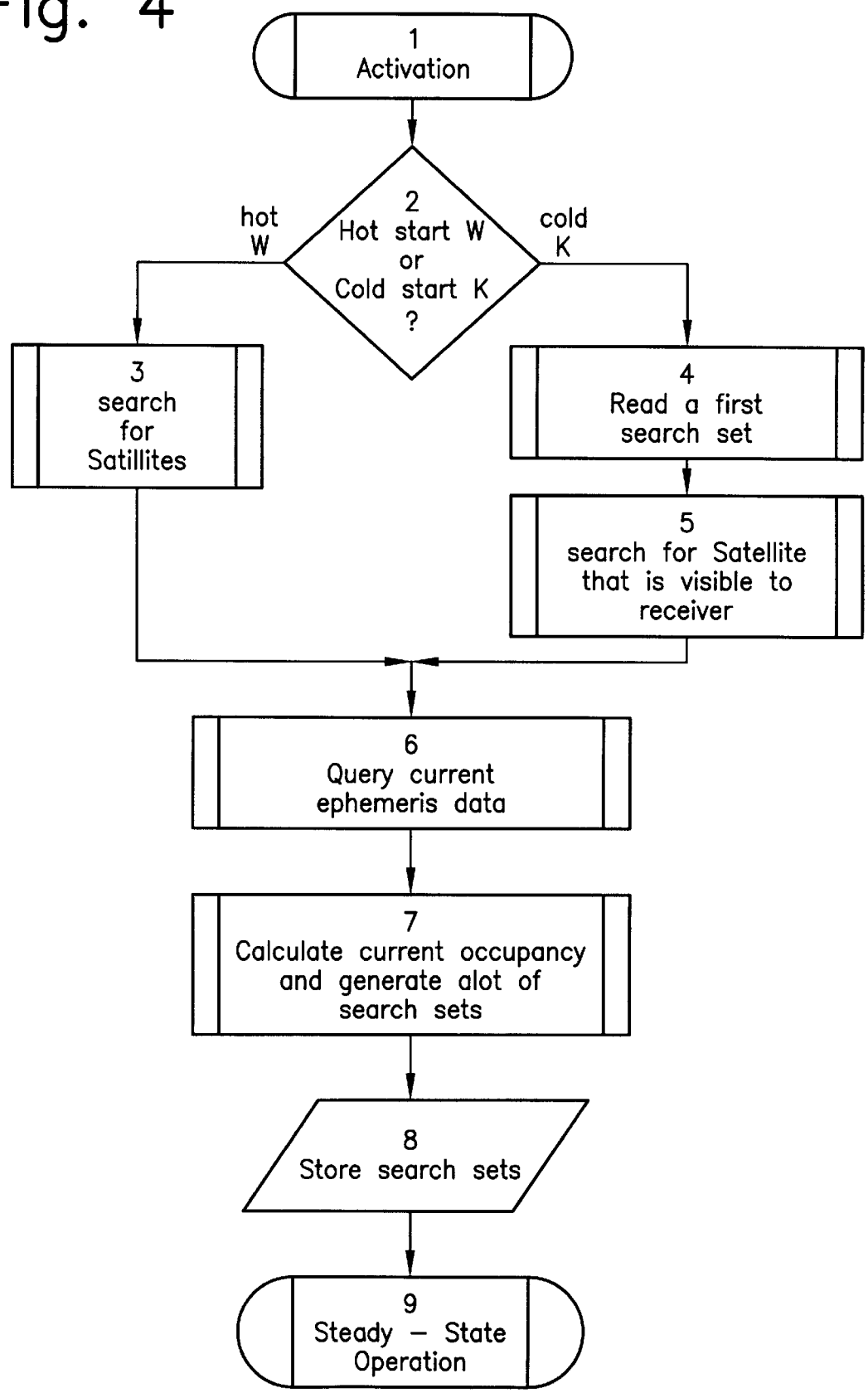
FIG. 4 shows the execution of the method according to the present invention.

A typical initialization using the method according to the present invention is depicted in FIG. 4. After activation of GPS receiver at step 1, start mode 2 begins. Here a decision must first be made as to whether a hot start W or cold start K is present. After a hot start the receiver can proceed directly, based on the operating parameters, to the search for satellites; but this does not concern the subject matter of the present invention. After a cold start K, no current operating parameters or current satellite identifiers are located in memory. The receiver thus reads out from its resident memory a first search set at step 4 configured as defined by the method according to the present invention. Using the first search set from step 4, which in the case of an eight-channel receiver comprises eight PRN numbers of possible satellite transmitters, the search begins at spet 5 for a satellite that is visible to the receiver. As soon as the receiver has received the signal of the first satellite, it begins to query the current ephemeris data at step 6. The ephemeris data contain all the current orbit and operating parameters of the active satellites. The first active satellite transmits to the receiver five data frames, of which the first three data frames contain information regarding position, absolute time, etc. The ephemeris is transmitted in the fourth data frame. The information regarding the individual satellites is transmitted in five subframes, the transmission rate being 50 baud. Transmission of the data for a total of 32 possible satellite identifiers—of which, according to the system specification, 24 satellite identifiers are generally allocated to the active satellites—takes a maximum of 12.5 minutes. The receiver then calculates from the ephemeris the current occupancy of the various orbital planes by the satellites, and generates, as defined by the method according to the present invention, a list of applicable search sets at step 7.

Once the current search sets have been calculated from the current ephemeris data, the sets calculated in this fashion are stored in resident memory at step 8. The receiver then begins its steady-state operation at step 9 until switched off. The current data do not need to be updated while the receiver is being operated. Only at the next cold start are the search sets updated based on the current ephemeris for the satellites. A further embodiment makes it possible to perform a cyclic repetition of the calculation for search sets, for example every 24 hours, thus ensuring that current adaptive search sets are generated even for continuously operating GPS receivers.

In addition to the calculation and resident storage of search sets as set forth here, resident storage of initial position and ephemeris from the most recent operation, with output of the navigation data of the GPS receiver, is also possible. In this case, when a cold start later occurs and once the first satellite is received, adjacent satellites can be calculated immediately from the ephemeris stored in resident memory and a directed search can be initiated. With an embodiment of this kind, the long acquisition phase for transmission of the ephemeris can be shortened. The possibility exists in this case, however, that after a long period of non-operation, the ephemeris will be more or less outdated. Decision criteria for the use of old ephemeris data must therefore be taken into account. One criterion, for example, is the time period during which the receiver was inactive. One possibility is to utilize the operating data within a day or a week, but after that time to have recourse to the stored search set.

Figure 5:
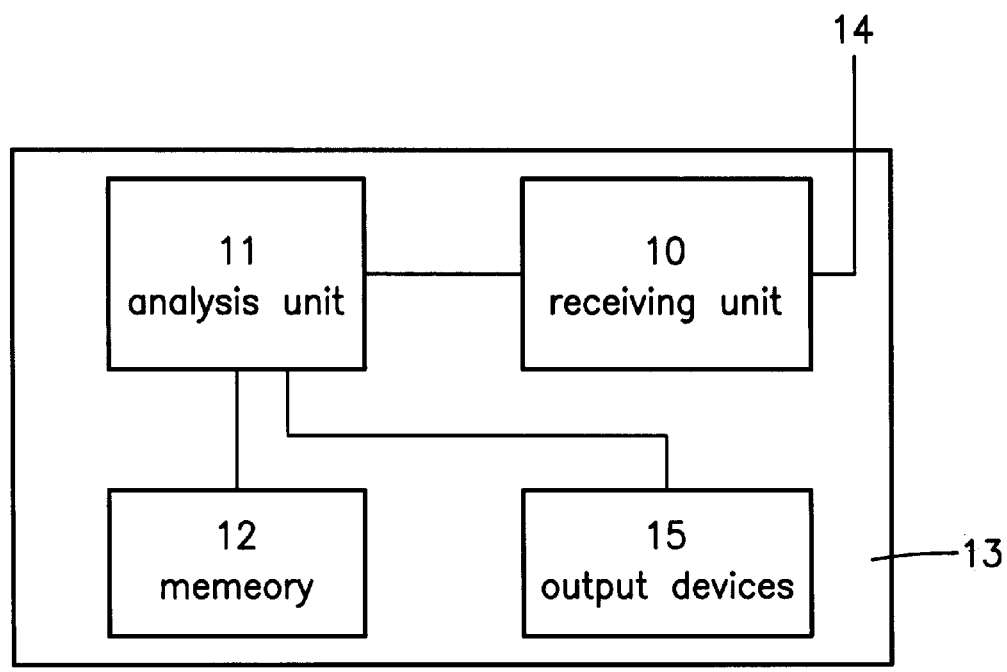
FIG. 5 shows a receiver according to the present invention.

As shown in FIG. 5, receiver 13 receives signals 14 from the satellites. Receiving unit 10 forwards the signals to an analysis unit 11, where the current search sets are calculated and stored in memory 12. The sequences of identifiers in memory 12 can be utilized when a restart occurs. The position determination results calculated by the analysis unit can be output graphically 15, or are input into a navigation system for further processing. Also conceivable is an embodiment of the method in which the ephemeris information is already being used while the ephemeris is still being transmitted. For example, if orbital data for a satellite adjacent to an already-received satellite are received early on, the directed search for that satellite can be initiated with one receiver channel, while with the remaining receiving channels, the search continues using the sequences defined by the search sets.

What is claimed is:

1. A method for initializing a receiver for a satellite-assisted location system, comprising the steps of:

determining, via the receiver, a three-dimensional position as a function of time-of-flight measurements to satellites, the satellites being located on orbital paths around the Earth, each one of the orbital paths defining a plane in which the one of the orbital paths is located; and searching for a first satellite including the steps of selecting all the satellites along at least two orbital paths, the at least two orbital paths defining two planes, the two planes enclosing an angle lying in a range from 80 to 100 degrees, and storing a first sequence of transmitter identifiers in the receiver, the first sequence of transmitter identifiers being associated with the selected satellites.

2. The method according to claim 1, wherein the angle is 90 degrees.

3. The method according to claim 1, further comprising the step of:

selecting a new sequence of transmitter identifiers if the search for the first satellite using the first sequence of transmitter identifiers is unsuccessful, the selection of the new sequence including selecting orbital paths that have not yet been searched.

4. The method according to claim 1, further comprising the step of:

if a first receivable transmitter is found, performing the steps of transmitting current transmitter identifiers and transmitter data for all other transmitters, calculating current sequences of transmitter identifiers as a function of the transmitted current transmitter identifiers and transmitter data, and storing the current sequences of transmitter identifiers in a memory device.

5. The method according to claim 4, further comprising the step of:

repeating the steps of transmitting, calculating and storing the current sequences of transmitter identifiers at a predefined time interval.

6. The method according to claim 4, further comprising the step of:

storing positions of the satellites in the receiver at a time the current sequences of transmitter identifiers are stored.

7. The method according to claim 1, further comprising the step of:

if position data of the satellites were stored at an earlier time, accessing at least one of stored sequences of transmitter identifiers and the stored position data of the satellites as a function of a definable criteria.

8. The method according to claim 1, further comprising the step of:

processing the first sequence of transmitter identifiers in the receiver using at least a portion of a plurality of available receiver channels.

9. The method according to claim 8, wherein the first sequence of transmitter identifiers is processed using all of the plurality of available receiver channels.

10. A receiver of satellite signals, comprising:

an analysis unit determining a three-dimensional position as a function of time-of-flight measurements to satellites, the satellites being located on orbital paths around the Earth, each of the one orbital paths defining a plane in which the one of the orbital paths is located, the analysis unit further searching for a first satellite by selecting all the satellites along at least two orbital paths, the at least two orbital paths defining two planes, the two planes enclosing an angle lying in a range from 80 to 100 degrees; and a nonvolatile memory configured for storing several sequences of transmitter identifiers including a first sequence of transmitter identifiers, the first sequence of identifiers being associated with the selected satellites.

* * * * *